United States Patent
Ganusov et al.

(10) Patent No.: US 9,729,153 B1
(45) Date of Patent: Aug. 8, 2017

(54) MULTIMODE MULTIPLEXER-BASED CIRCUIT

(71) Applicant: Xilinx, Inc., San Jose, CA (US)

(72) Inventors: Ilya K. Ganusov, San Jose, CA (US); Benjamin S. Devlin, New York, NY (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/234,640

(22) Filed: Aug. 11, 2016

(51) Int. Cl.
| H03K 19/096 | (2006.01) |
| H03K 19/173 | (2006.01) |
| H03K 19/177 | (2006.01) |
| H03K 19/20 | (2006.01) |

(52) U.S. Cl.
CPC ..... *H03K 19/1737* (2013.01); *H03K 19/1776* (2013.01); *H03K 19/20* (2013.01)

(58) Field of Classification Search
CPC . H03K 19/1737; H03K 19/1776; H03K 19/20
USPC .............................. 326/21, 26–28, 93, 95, 98
See application file for complete search history.

(56) References Cited

U.S. PATENT DOCUMENTS

| 5,416,367 A * | 5/1995 | Chan et al. ........ | H03K 19/1737 326/41 |
| 8,536,896 B1 * | 9/2013 | Trimberger ...... | H03K 19/17736 326/38 |
| 2002/0181559 A1 * | 12/2002 | Heidari-Bateni et al. ...... | H04B 1/711 375/148 |
| 2009/0167350 A1 * | 7/2009 | Madurawe et al. ........ | H03K 19/17728 326/40 |
| 2009/0243652 A1 * | 10/2009 | Dorairaj et al. ..... | G11C 7/1006 326/38 |
| 2013/0321025 A1 * | 12/2013 | Kurokawa et al. .. | H03K 19/177 326/41 |
| 2014/0266356 A1 * | 9/2014 | Dinh et al. ............ | H03K 5/159 327/161 |
| 2016/0112035 A1 * | 4/2016 | Kurokawa ............ | H03K 3/012 326/93 |

OTHER PUBLICATIONS

U.S. Appl. No. 14/835,571, filed Aug. 25, 2015 Devlin, Benjamin S. et al., Xilinx, Inc., San Jose, CA USA.

* cited by examiner

*Primary Examiner* — Jason M Crawford
(74) *Attorney, Agent, or Firm* — LeRoy D. Maunu

(57) ABSTRACT

A device includes a multiplexer circuit with a plurality of input circuits. Each input circuit is connected to a respective input node and a shared output node. The input circuits are configured to pass, in response to a respective control signal, a signal between the respective input and shared output node. An output circuit is configured to store data from the shared output node in a latch mode and to act as a buffer in a pass-through mode. A control circuit is configured to switch, in response to a configuration signal, the output circuit between the latch mode and the pass-through mode.

16 Claims, 8 Drawing Sheets

MULTIMODE MULTIPLEXER-BASED CIRCUIT

TECHNICAL FIELD

The disclosure generally relates to multimode multiplexer circuits, and more particularly to multiplexers that can be configured to operate in more than one mode using pulse latches.

BACKGROUND

There are a variety of different applications that can use configurable routing logic including, but not limited to, programmable integrated circuits, programmable logic devices (PLDs), and System on Chip (SoC) devices. Some SoC devices can include programmable logic that is similar to programmable logic provided by various PLDs. PLDs are a type of programmable integrated circuit (IC) that can be programmed to perform specified logic functions. One type of PLD, the field programmable gate array (FPGA), can include an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay locked loops (DLLs), bus or network interfaces such as Peripheral Component Interconnect (PCI), PCI Express (PCIe) and Ethernet, and so forth. Routing logic blocks provide connectivity between programmable tiles and their components. The routing logic can be configured to store data being transferred between tiles in one or more registers. As the size of the routing logic increases and certain routing architectures are used, the physical area consumed by routing logic, such as multiplexers and associated registers can become significant.

These and other problems can be problematic for IC design and their uses.

SUMMARY

A number of implementations are directed toward a device that includes a multiplexer circuit with multiple modes of operation.

Certain implementations relate to a device that includes a multiplexer circuit with a plurality of input circuits. Each input circuit is connected to a respective input node and a shared output node. The input circuits are configured to pass, in response to a respective control signal, a signal between the respective input and shared output node. An output circuit is configured to store data from the shared output node in a latch mode and to act as a buffer in a pass-through mode. A control circuit is configured to switch, in response to a configuration signal, the output circuit between the latch mode and the pass-through mode.

Various implementations of the present disclosure relate to a method for providing multiplexing functionality with a device. The method includes receiving a set of control signals and enabling, in response to the set of control signals, an input circuit from a plurality of input circuits. Each input circuit is configured to pass, in response to a respective control signal from the set of control signals, a signal between a respective input and a shared output node. Data from the shared output node is stored in an output circuit and in response to a clock signal, while the output circuit is in a latch mode. In response to a configuration signal, the output circuit is switched from the latch mode to a pass-through mode by fixing the clock signal to allow data to pass from the shared output node to a latch of the output circuit Other features will be recognized from consideration of the Detailed Description and Claims, which follow.

BRIEF DESCRIPTION OF THE DRAWINGS

Various aspects and features of the method, device, and system will become apparent upon review of the following detailed description and upon reference to the drawings in which.

DETAILED DESCRIPTION

Figure 1:
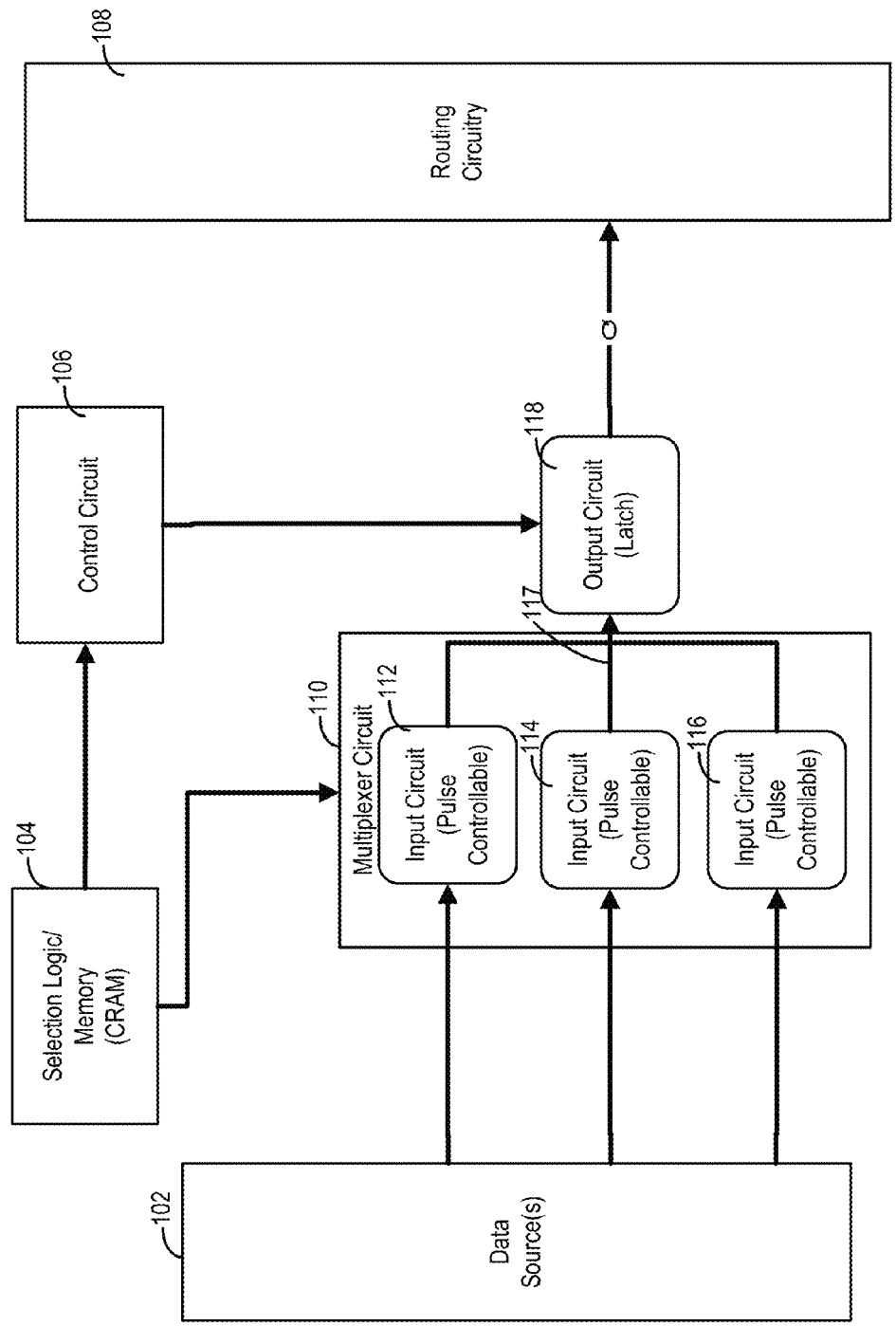
FIG. 1 is a block diagram for a system with a multiplexer circuit, consistent with various implementations of the present disclosure.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are directed toward multiplexer-based circuits that use pulse latches to provide both multiplexing and register functions, which can be useful in the context of routing logic within an IC. The multiplexer-based circuits can be configured to operate in multiple different modes depending upon configuration settings for the multiplexer-based circuits. For example, a multiplexer-based circuit can be configured to operate as a multiplexer with a pass-through output in a first mode and as a multiplexer with a latched or registered output in a second mode.

Certain implementations are directed toward multiple uses of pulse-latch circuitry to provide an increased density of registers for programmable logic routing solutions. The logic/physical area used to add the registers can be relatively low due to sharing circuitry used for other purposes. For instance, portions of the multiplexer circuits, such as an output buffer circuit, can be reused to gate incoming data in order to serve as part of a latch circuit. In combination with one or more pulse-controlled circuits, the latch can operate as a pulse-latch. Using configuration settings of the IC, the output pulse-latches of the multiplexers can be used either as a pass-through multiplexer or as a circuit with both multiplexer and an output latch that provides register storage capabilities.

Various implementations are directed toward the use of multiplexer-based circuits within the context of routing logic of a PLD or SoC. A number of different factors, including techniques used to improve performance and area on high speed designs, contribute to a need for high register density with low area consumption. Depending upon the particulars of a programmable logic solution, registers can be implemented by reusing a portion of multiplexer circuits that are used for latching a value when the multiplexer is not being used. Additional register functionality can be provided using a feedback path from the output node. A feedback circuit drives the feedback path to store a value when no input is present. In certain implementations, a pass-gate circuit is added to control the timing (clocking) for when the value of the register is set by an input signal. In various implementations, pass-gate circuits of the multiplexer circuit are used for a similar purpose.

Various aspects of the present disclosure are based upon a recognition that multiplexers in PLD designs are often already situated at locations where a register could be advantageously placed. For example, the middle of a long delay net is often a good location for a register when pipelining is being used. By adding register capabilities to multiplexer circuits already present at the location, extra detouring/re-routing, used to otherwise add a register, can be avoided. This can simplify and improve placement and routing runtime and reduce PLD/FPGA logic resource usage.

As may be relevant to increasing register count in a PLD, logic folding is a technique that is sometimes used to improve performance of programmable logic. Logic folding combines logic that is identical between modules by reusing the same logic for use by the different modules in order to reduce area. The shared logic is operated at an increased frequency, which allows for time sharing access to the logic. Logic folding can also reduce circuit area and wire length, which can improve performance of a design. Assuming that the output from each time sharing operation is stored, then separate registers are required for each potential module/fold. In other words, if a programmable logic block can be shared with two different modules, two registers would be implemented at the output of the programmable logic block (one for each module). The result can be an increased density for the registers, relative to programmable logic blocks that are not designed for logic folding.

An example of another technique is pipelining of logic functions. By breaking the logic functions into smaller operations, the operating frequency can be increased, which can increase data throughput. A side effect of pipelining is that it can increase input-to-output cycle latency. Feedforward paths can be pipelined to increase performance, but certain types of logic are not easily pipelined (e.g., logic with feedback loops). Adding a pipeline stage to a critical path can require pipelining of other parallel paths so that interrelated timing dependencies can be maintained. The timing requirements can lead to the use of a large number of additional registers, which can increase the density of the registers.

Yet another example technique is time-borrowing, where skew of a clock that is used by the registers can be controlled on time-critical paths. Time-borrowing can be used to compensate for flip-flops that are not physically located in an ideal location. By introducing an intentional skew to the clock of the flip-flops, timing requirements can be met by making the flip-flops appear to be located at a different location (e.g., virtually moving a flip-flop to the middle of a long interconnect).

Consistent with various implementations, a control circuit provides the logical functions that allow the multiplexer circuits to switch between different modes of operation. In particular implementations, the control logic is shared between multiple multiplexer circuits. For example, the control circuit can be shared between groups of multiplexer circuits that drive the same look-up-table (LUT).

Turning now to the figures, FIG. 1 is a block diagram for a system with a multiplexer-based latch circuit, consistent with various implementations of the present disclosure. The multiplexer circuit 110 and output circuit 118 receive and store data from data sources 102. In particular implementations, the data sources 102 are connected to the multiplexer circuit through routing logic of a PLD. The output of the multiplexer circuit 110 is provided to an output circuit 118, which can operate as either a register/latch or a pass-through circuit. The output (Q) of output circuit 118 is provided to routing circuitry 108.

Consistent with various implementations discussed herein, the combination of the multiplexer circuit 110 and the output circuit 118 are configured to operate in multiple modes. In a first, pass-through mode, the circuits operate as a pass-through multiplexer by enabling a particular pulse-controlled input (pass) circuit from the input circuits 112, 114 and 116. The input circuits 112, 114, and 116 are each configured to drive a shared node 117 that is provided as an input to the output circuit 118. The output circuit 118 passes the signal on the shared node to an output node asynchronously and without latching the data. In a second, latch (or register) mode, the multiplexer circuit 110 and the output circuit can be used together to operate as a multiplexer with an output latch.

The input circuits 112-116 can each be activated by a respective control signal. When activated, the input circuits 112-116 pass a respective input signal to a shared output node of the multiplexer circuit 110. In this manner, any one of the multiple input circuits can be enabled, while the other input circuit remain disabled, in order to provide a multiplexing function.

According to various implementations, selection logic/memory circuit 104 can provide the control signals to the input circuits 112-116. The selection logic/memory circuit 104 can also provide a configuration signal to a control circuit 106. Control circuit 106 then places the multiplexer circuit 110 and the output circuit 118 into a mode that is indicated by the control signal. In particular implementations, the control circuitry 106 can provide appropriately-timed (based upon the indicated mode) clock signals or clock pulses for the latch mode.

Consistent with various implementations, the data sources and logic and routing circuitry 102 and 108 can be part of the programming logic and routing fabric of a programmable logic device. For example, a multiplexer-based circuit 110, 118 can be used either to store data from look up table (LUT) outputs or from bypass pin inputs.

According to certain implementations, the multiple modes are supported by sharing logic that would have been present in a multiplexer circuit 110 that did not have the latching capability. This allows for the creation of an additional functional register with low overhead, while also preserving the original the functionality of the corresponding configurable logic element (CLE).

In certain implementations, the selection logic/memory circuit 104 can be implemented as part of a configuration random access memory (CRAM) circuit that stores configuration data of the programmable logic device. In certain implementations, a programmable logic device can share the control circuit 106 with multiple multiplexer-based circuits 110, 118. Each of the sharing multiplexer-based circuits would be placed into the same mode by the shared control circuit 106.

Figure 2:
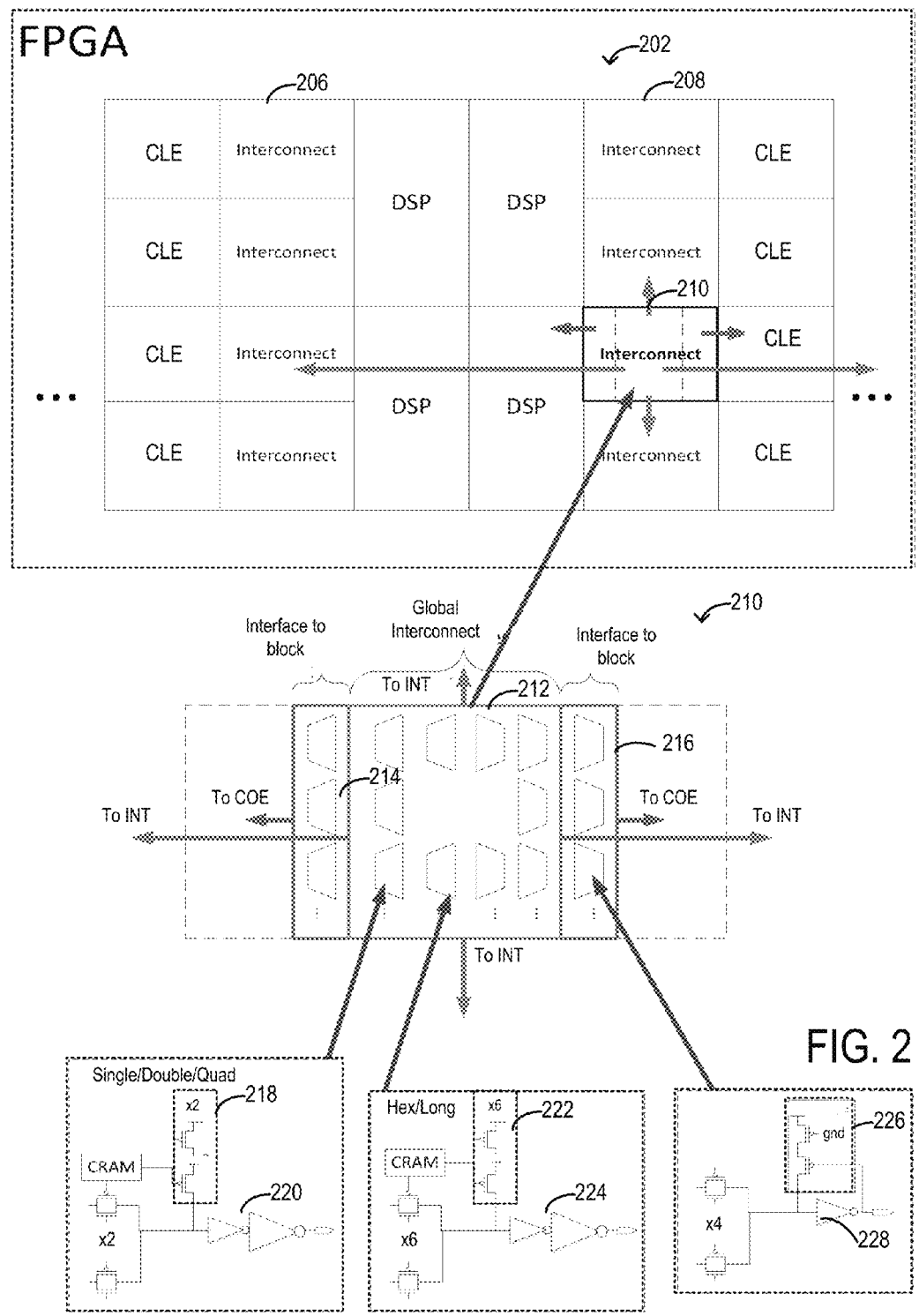
FIG. 2 depicts a block diagram showing a possible location of multiplexer-based circuits in the context of a programmable logic device (PLD/FPGA), consistent with implementations of the present disclosure.

FIG. 2 depicts a block diagram showing a possible location of multiplexer-based circuits in the context of a programmable logic device (PLD/FPGA), consistent with implementations of the present disclosure. The back-to-back (B2B) interconnect structure of the FPGA shows a number of different programmable tiles 202. The programmable tiles are connectable using interconnect columns 206 and 208.

An expanded view of an interconnect tile 210 shows of groups of global interconnection multiplexers 212 that are arranged in columns and connected to global interconnection lines. The global interconnection lines can route signal between tiles of varying distances from the interconnect tile 210. The expanded view also shows (local) interface blocks 214 and 216, which include a number of interface multiplexers. The interface multiplexers connect directly to neighboring programmable tiles using local interconnection lines.

According to certain implementations, the global interconnection lines can be used as unidirectional connections or point-to-point links to other tiles. The different interconnection wires can provide connections to a different number of tiles and to tiles at varying distances from the interconnect tile 210. The following description of interconnection lines provides a number of non-limiting examples. For example, a first set of interconnection lines might be directly linked to only a single interconnect tile, such as through a direct connection to a neighboring tile. Direct connect lines route signals to neighboring tiles: vertically, horizontally, and diagonally. These lines might drive a signal from a source tile to another interconnection line. Double lines connect to two tiles. Collectively, the double lines connect to every other tile, both horizontally and vertically. Hex lines also connect to two tiles, while providing a connection to one out of every three tiles. Long lines connect to one out of every six interconnect tiles across the entire device.

Consistent with various implementations, the signal drive strength requirements for the output nodes for the multiplexers can increase with respect to the number of connected tiles and total line length. For example, the interface multiplexers, in interface blocks 214, 216, could use direct connections that are subject to a relatively low loading, while at least some of the global interconnection multiplexers 212 could use longer connections that have significantly more loading. According to particular implementations, the loading differences can be accounted for using different driver circuits for the output of the multiplexer circuits. For instance, the interface multiplexers 214, 216 can use simple buffers, such as a single inverter driver/buffer circuit 226, while the global interconnect multiplexers use more buffers with additional drive strength. An example of a stronger buffer is shown by circuits 220, 224, which include a first inverter with a relatively low drive strength that is followed by larger inverter with a higher drive strength.

In particular implementations, the internal node between the multiplexer circuit and the buffer (output) circuit can be pulled up (or down) when the multiplexer circuit is not being used by the programmable logic implementation. This provides a known and steady-state value to the output for the multiplexer circuit. For example, the inverter driver/buffer circuit 226 can be implemented as half-latch circuit between the multiplexer circuit and the output (buffer) circuit 228. When the parasitic capacitance and resistance begin to dominate, relative to the drive strength for transistors, the PLD can use a pull-up (full stack) circuit 218, 222 that is set by a configuration signal, which can be set as part of the programming of the device logic, e.g., in a Configuration Random Access Memory (CRAM) circuit.

Figure 3:
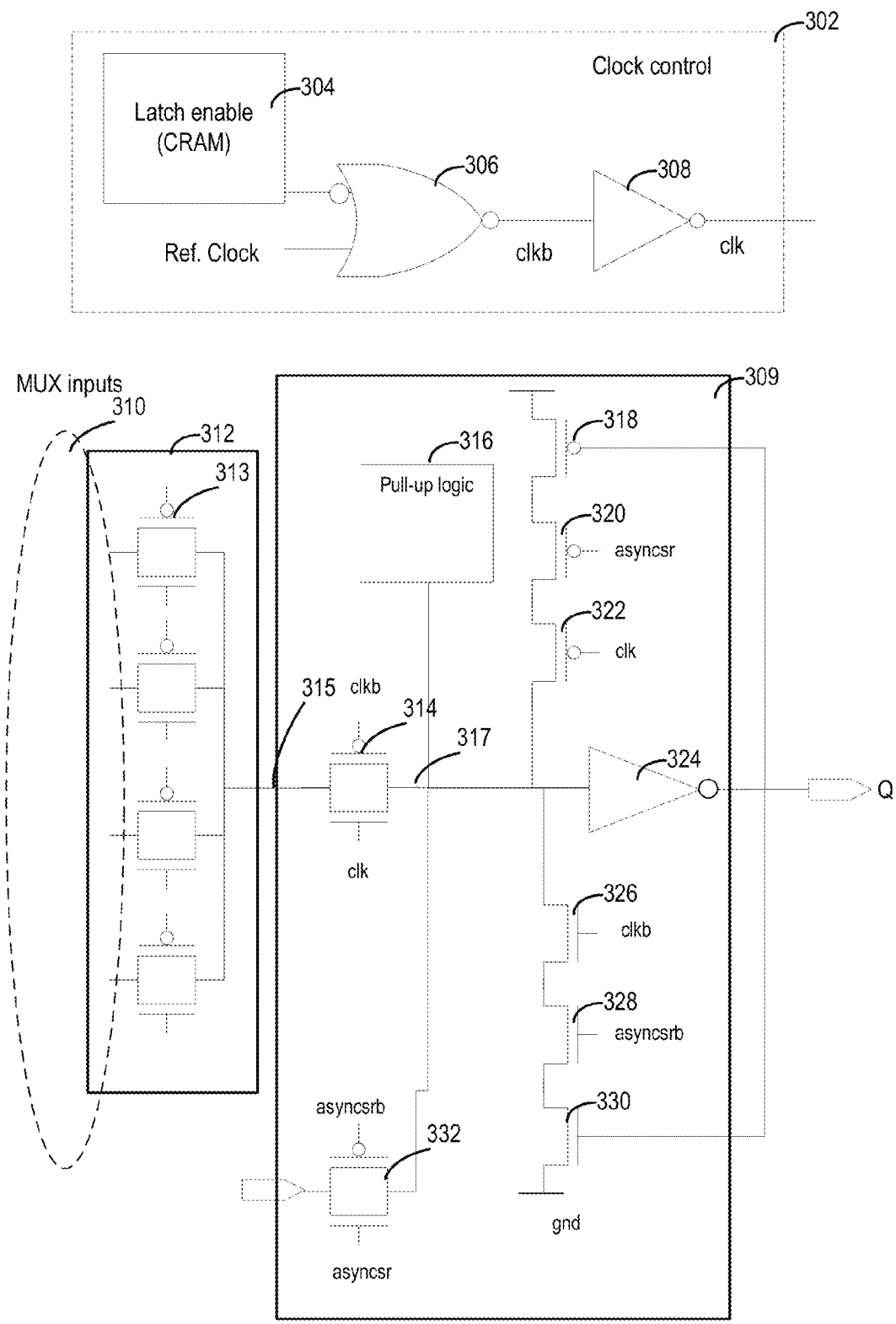
FIG. 3 depicts a circuit that functions as multiplexer-based circuit with pass-through or registered output and that uses a pass-gate that is shared between inputs of the multiplexer, consistent with implementations of the present disclosure.

FIG. 3 depicts a circuit that functions as multiplexer-based circuit with pass-through or registered output and that uses a pass-gate that is shared between inputs of the multiplexer, consistent with implementations of the present disclosure. According to various implementations of the present disclosure, the depicted circuit can be used as part of an interconnect tile of a PLD device. The depicted circuit can operate in either of two modes by controlling a clock signal that enables a bypass circuit, shown as pulse-based pass-gate circuit 314. In particular, the clock control circuit 302 receives a configuration signal and a reference clock signal. The source of the clock signal can be provided from a neighboring CLE block or from other clock sources. In particular implementations, the CLE clock can be provided by a time-borrowing circuit that generates pulses with a controllable duty cycle. When enabled by the configuration signal, the clock control circuit 302 generates a differential signal pair (clk and clkb) from the reference clock signal.

The latch enable CRAM 304 provides the configuration signal, which indicates whether or not the output circuit 309 is in a latch mode or a pass-through mode. In the depicted circuit, a low ("0") configuration signal corresponds to a pass-through mode because the output (clkb) of the NOR gate 306 will then be low irrespective of the reference clock value. This output is then provided to an inverter buffer 308 to generate the clk signal, which is used with the clkb signal to enable the pass-gate circuit 314. When the combination of the clkb and clk signal remains active in this regard, any input signal received by the pass-gate circuit 314 will be immediately passed to the inverter buffer 324, which drives the output node Q. Accordingly, the output circuit 309 is configured to operate in the pass-through mode.

When the configuration signal is high ("1"), the output of the NOR gate 306 will be responsive to the reference clock. In particular, the NOR gate 306 functions as an inverter buffer circuit. The result is that the clkb and clk signals will mirror the reference clock signal. The pass-gate circuit 314 will then control the timing for latching of data that is received from the multiplexer circuit 312 by passing data depending upon the clk/clkb clock phase. In the depicted configuration, the input data is passed when clk=1 and clkb=0; and blocked when clk=0 and clkb=1.

The depicted multiplexer circuit 312 includes a set of pass-gate circuits 313 that when activated allow one of the multiplexer input signals 310 to be passed to a shared output node 315. The multiplexer function is controllable using a separate differential control signal for each of the pass-gates in the multiplexer circuit 312. In particular, the set of differential control signals will enable a selected pass-gate circuit, while disabling the remaining pass-gate circuits.

The output circuit 309 includes a feedback circuit that drives a feedback path from the output of the inverter buffer 324 to the input of the inverter buffer 324. In particular, the output node Q drives transistors 318 and 330. Transistors 318 and 330 are part of respective transistor stacks that form the feedback circuit. A first stack includes transistors 318, 320, 322, and a second stack includes transistors 326, 328, 330. The two transistor stacks collectively function as an inverter by providing either a pull-up or pull-down to the node 317, which is connected to the input of the inverter buffer 324. Accordingly, the combination of the buffer 324 and the transistor stacks function as a latch that stores data received from the pass-gate circuit 314.

When the output circuit 309 is in the latch/register mode, the clk and clkb signals latch the provided data by enabling the feedback circuit when the pass-gate circuit 314 is disabled and a MUX input signal is not driving the node 317. To avoid contention between the feedback circuit and the signal received from the pass-gate circuit 314, the clk and clkb signals disable the feedback circuit when the pass-gate circuit 314 is active and allow the input signal to drive node 317. Accordingly, the output circuit 309 operates as a register by storing data received from a selected input of the multiplexer inputs 310, where the timing for the storing is controlled by upon the phase of the clk/clkb signals.

According to various implementations, when the output circuit 309 is in pass-through mode, the clk and clkb signals turn off the transistors 322 and 326, respectively. This disables the feedback circuit and the output circuit 309 functions as a pass-through (buffer) circuit that does not latch received data.

Consistent with certain implementations, the output circuit 309 can be configured to allow for asynchronous setting/resetting of stored data. In the depicted circuit, the differential SR signal pair asynchsr and asynchrsrb control the asynchronous reset. When the differential reset signal is active, transistors 320 and 328 are turned off to disable the feedback path. At the same time, the pass-gate circuit 332 is activated to set the value of the output circuit to a desired value, which could be either "0" or "1" depending upon whether the desired behavior is a set or a reset. When the differential reset signal is inactive, the pass-gate circuit 332 is disabled and the transistors 320 and 328 are enabled. In implementations where synchronous setting/resetting is desired, the SR signal can be synchronized to the reference clock signal (e.g., using an AND gate) before being provided to the output circuit 309. In implementations where setting/resetting functionality is not desired, the pass-gate 332 and transistors 320 and 328 can be removed from the circuit.

According to various implementations, a pull-up logic circuit 316 can provide a pull-up to the shared node 317. For instance, the pull-up logic circuit 316 can be implemented consistent with the pull-up circuit(s) discussed in connection with FIG. 2

Consistent with certain implementations, the differential clock signal pair (clk, clkb) provided by the control circuit 302, and responsive to CRAM 304, can be shared across multiple multiplexer/latch circuits. The grouping and number of multiplexer-based circuits that share a single clock signal pair can vary according to the particular architecture. For instance, multiplexer-based circuits that that are used as inputs to the same LUT can be grouped together because the timings and configurations are more likely to be the same. As an example, if one input to an LUT enables the latch mode for pipelining purposes, each of the inputs is likely to also be configured to enable the latch mode for pipelining purposes.

Figure 4:
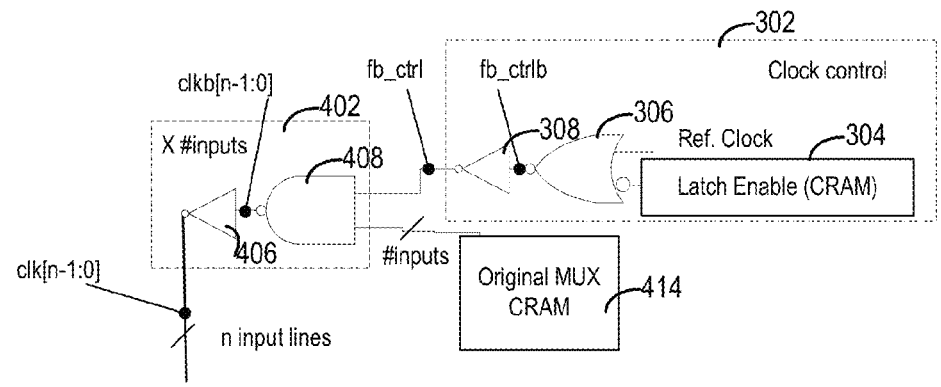
FIG. 4 depicts a circuit that functions as multiplexer-based circuit with pass-through or registered modes by synchronous control of pass-gates for respective inputs of the multiplexer, consistent with implementations of the present disclosure.
Figure 4:
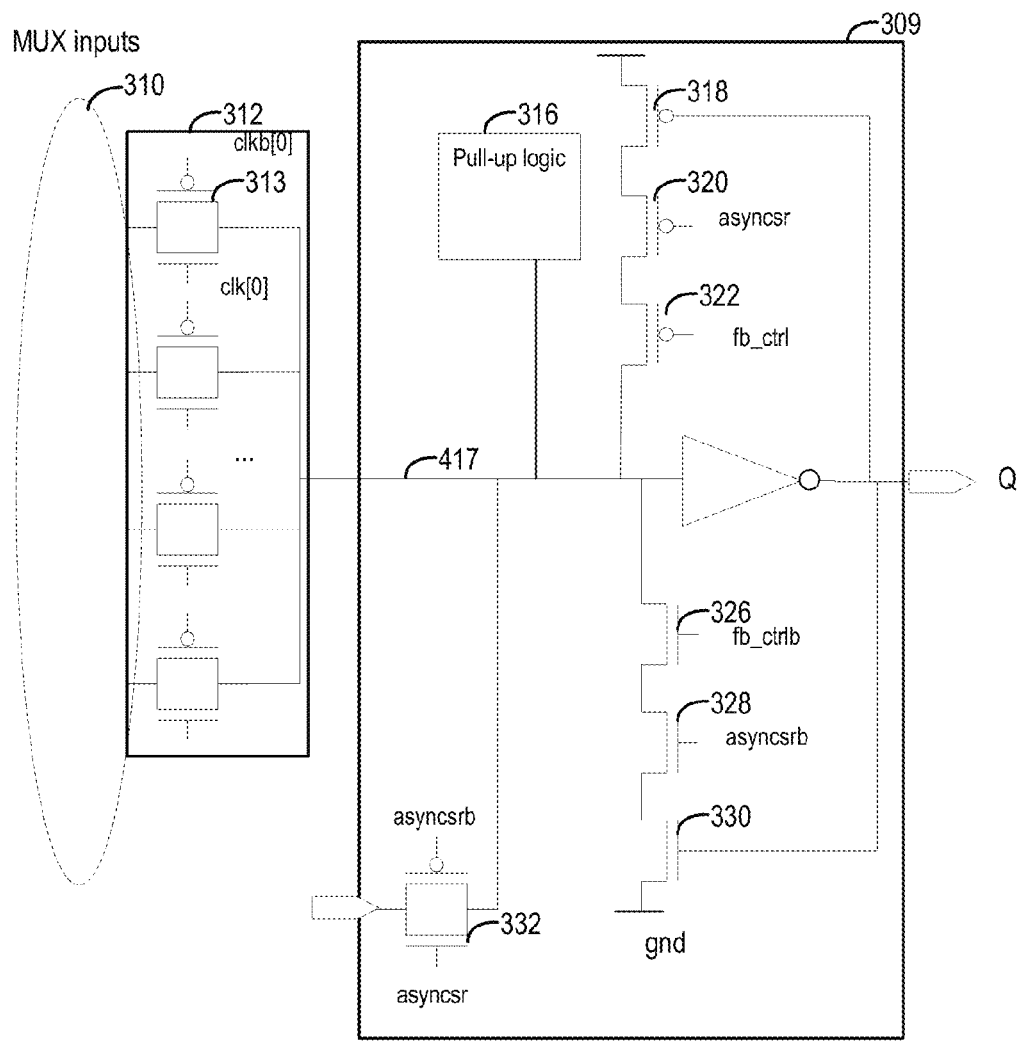

The circuit diagram depicted in FIG. 3 is provided as an example from which variations are possible. An example of such variations is discussed in connection with FIG. 4. Circuit components and blocks that provide similar functionality, relative to FIGS. 3 and 4, are identified using common reference numerals. For the sake of brevity, some of the descriptions from FIG. 3 are not repeated when discussing similar elements in FIG. 4.

FIG. 4 depicts a circuit that functions as multiplexer-based circuit with pass-through or registered modes by synchronous control of pass-gates for respective inputs of the multiplexer, consistent with implementations of the present disclosure. One manner in which the circuit of FIG. 4 differs from FIG. 3 is that the pass-gate circuit 314 has been removed. In effect, the function provided by the pass-gate circuit 314 has been moved to the individual pass-gates of the multiplexer circuit 312. In certain instances, the removal of the pass-gate circuit 314 reduces the load on the input data paths and thereby reduces signal routing delay. Moreover, each output circuit 309 contains one less pass-gate and takes up less physical real estate on an integrated circuit chip or die. The pass-gate circuit 314 provided synchronous control over the input to the latch of the output circuit 309. A similar synchronous control over data present on node 417 is provided using synchronous control of the pass-gates 313. The node 417 serves both as the shared output node of the multiplexer circuit 312 and the input to the buffer circuit 324.

To control the pass-gates 313 in a synchronous manner, additional control logic 402 generates sets of clock-synchronous multiplexer control signals (clk[ ], clkb[ ]). Each set of multiplexer control signals controls a corresponding pass-gate of the multiplexer circuit 312. As discussed in connection with FIG. 3, clock control circuit 302 is responsive to a configuration signal (from latch enable CRAM 304) and a reference clock signal. The source of the reference clock signal can be provided from neighboring CLE block or from other clock sources. When enabled by the configuration signal, the clock control circuit 302 generates a differential signal pair (fb_ctrl, fb_ctrlb) from the clock signal. The differential signal pair generated by clock control circuit 302 is used for controlling the feedback path of output circuit 309 but not for controlling pass-gates 313 of the multiplexer circuit 312. Accordingly, FIG. 4 labels the differential signal pair as fb_ctrl and fb_ctrlb, whereas the similar signals performed both functions and were labeled clk and clkb in FIG. 3.

The latch enable CRAM 304 provides the configuration signal, which indicates whether or not the output circuit 309 is in a latch mode or a pass-through mode. In the particular depicted circuit, a low ("0") configuration signal corresponds to a pass-through mode because the output (clkb) of the NOR gate 306 is low irrespective of the reference clock value. When the configuration signal is high ("1"), the output of the NOR gate 306 will be responsive to the reference clock, and the output circuit 309 will be in latch/register mode.

The additional control circuit 402 generates separate sets of differential signal pairs (clk[ ], clkb[ ]), which control the flow of data from MUX inputs 310 to the input to the latch of output circuit 309. The additional control circuit 402 is replicated for each separately controllable multiplexer input. For "n" inputs, this results in the generation of n differential signal pairs: clk[n−1:0], clkb[n−1:0]. To generate each signal pair, an AND gate 408 is used to gate each respective input based upon a corresponding control signal. An inverter buffer 406 then generates the complementary signal. For example, the multiplexer circuit 312 could be a four-to-one multiplexer, with four MUX inputs and four pass-gates 313. Control circuit 402 is replicated four times. Each instance of the control circuit 402 is linked to a different control signal, where each control signal represents the selection of a corresponding MUX input. To select the first input ([0]), the control signal [0] is set to a high ("1") value, while the remaining control signals [3:1] are set to a low ("0") value. The clk[3:1], clkb[3:1] signal pairs will be held static, due to the function of NAND gate 408, and at a value that disables the corresponding pass-gates 313. The clk[0], clkb[0] signal pair will then be synchronously driven by the reference clock. The latch of the output circuit 309 then latches data in a manner that is synchronous with the reference clock.

According to various implementations, the source of the control signals is MUX selection logic 414. In an FPGA/PLD environment, MUX selection logic 414 could be implemented as a CRAM, as one non-limiting example. For instance, a CRAM 414 could be programmed to select between multiple different MUX inputs 310 as part of a routing solution, such as where the circuit of FIG. 4 is part of an interconnection routing tile.

The removal of the pass-gate circuit 314 can be useful for reducing the loading on the data path that includes the shared node 317/417. Reduction in loading can improve (reduce) the signal delay or latency for the corresponding data path. It is noted that while the removal of pass-gate circuit 314 can save some physical space on the integrated circuit chip or die, the additional control logic 402, which is replicated for each input, takes up additional physical area. The net result may be an increase in physical space, particularly for wide multiplexer circuits with many inputs.

The circuits depicted in the preceding figures depict only a single output bit (Q) for simplicity. In certain implementations, multiple bits can be grouped together for selection purposes. For example, a data bus of width "x" can be formed from x multiplexer/latch circuits with a single control signal that used to select the same input for each multiplexer in the group.

Figure 5:
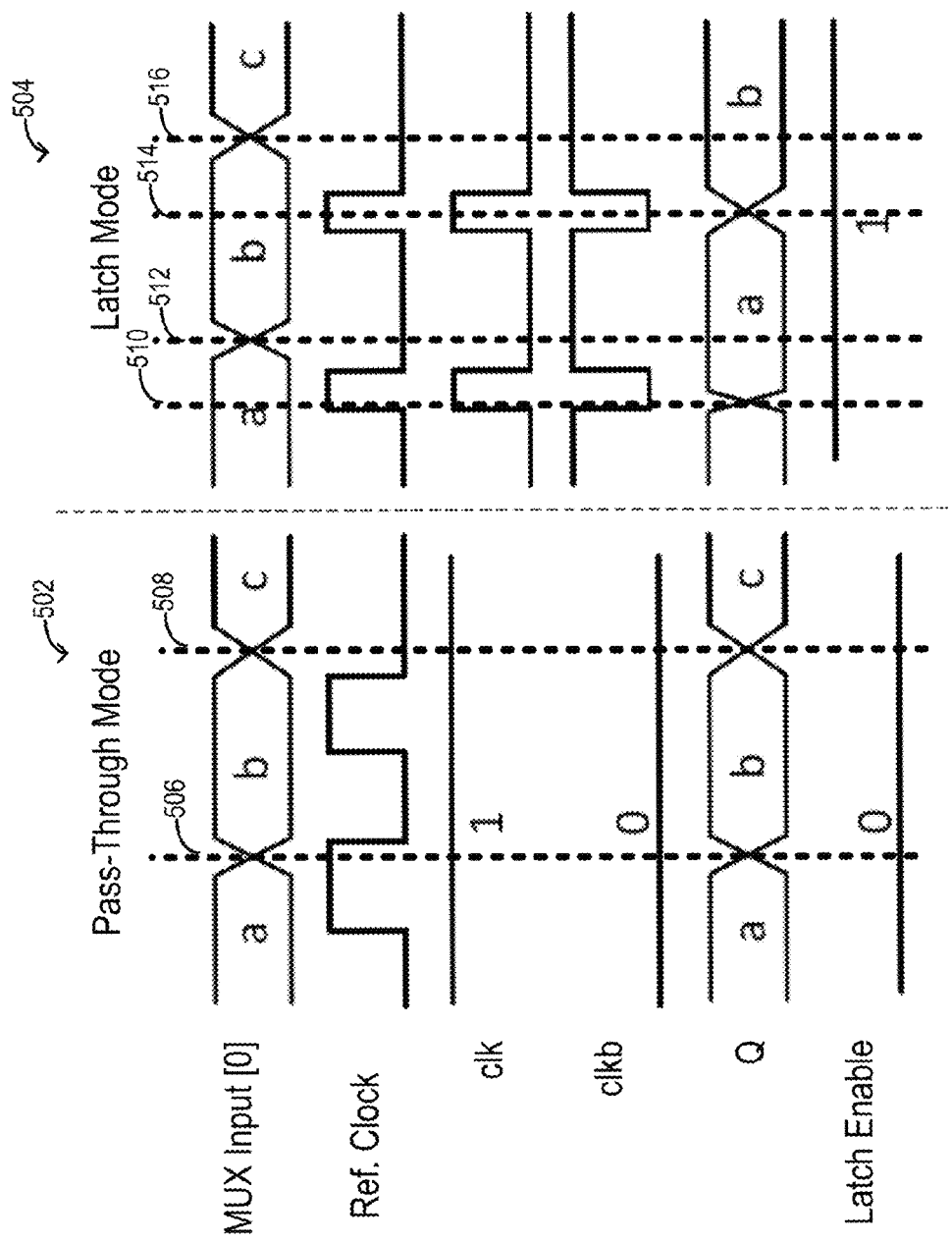
FIG. 5 depicts a signal timing diagram for circuits that are consistent with FIG. 3.

FIG. 5 depicts a signal timing diagram for circuits that are consistent with FIG. 3. The horizontal axis represents time with an arbitrary scale. The multiplexer (MUX) input [0] signal shows the value of selected multiplexer input. The values (a, b, c) represent arbitrary values. The different letters are presented for the purpose of showing changes to the input value, as may be relevant to when the changes are shown to appear on the output (Q).

The timing diagram is separated into two portions. A first portion 502 represents a situation in which the circuit is configured to operate in pass-through mode. The mode of the circuit is selected and controlled by the latch-enable bit. In the depicted example, the latch-enable bit is active high and the pass-through mode is selected by setting the bit low ("0"). A second portion 504 represents a situation in which the circuit is configured to operate in a latch/register mode, where the latch-enable bit is set high ("1"). It is noted that control and configuration signals can be either active high or low depending upon the desired configuration.

In the pass-through mode, the MUX input [0] and the output Q both start with a value "a". The clk and clkb signals are fixed (static) at: clk=1 and clkb=0. As discussed in connection with FIG. 3, the clk and clkb signals are generated by the clock control circuit 302 to enable the pass-gate circuit 314. The clk and clkb signals remain unaffected by the state (of phase) of the reference clock signal, which is depicted as oscillating with about a 50% duty cycle. Other duty cycles are possible.

At time point 506, the input[0] signal transitions from value "a" to value "b." With the circuit configured to operate in pass-through mode, the output Q signal value is not synchronous to the reference clock. Accordingly, the output signal value also transitions from value "a" to value "b" at time point 506. For simplicity, minor signal propagation delays through the circuit are not shown. A similar data transition event occurs at time point 508, with the output value Q signal value changing asynchronously, relative to the reference clock.

In the latch/register mode 504, the latch-enable signal is active (high or "1"). In the depicted situation, the MUX input[0] begins with a value "a," while the output signal Q begins with an unknown value. At time point 510, a reference clock pulse is provided. As discussed in connection with FIG. 3, a clock control circuit can generate a differential signal pair clk, clkb that mirrors, and is synchronous to, the reference clock signal. The differential signal pair clk, clkb control the pass-gate and feedback to latch data within the output circuit. Accordingly, the MUX input[0] value is stored in the latch and provided on the output Q at time 510.

At time point 512, the MUX input[0] value transitions from "a" to "b." The output value Q maintains (latches/stores) the prior value "a," until a clock pulse is provided by the reference clock, as indicated at time 514. The depicted delay between the clock pulse and Q transition represents the propagation delay of the latch circuit. At time 516, the MUX input[0] value transitions to a "c" value. No subsequent reference clock pules are received, and therefore, the Q output maintains the prior "b" value. According to various implementations, the reference clock pulses provided to the clock control circuit can be gated by a separate control signal to allow data to be held for longer than a single clock period.

The depicted waveforms show a 50% duty cycle clock (reference clock) for the pass-through mode and less than a 50% duty cycle for the latch mode. The duty cycle is discussed relative to the voltage that activates the pulse-latch circuits. By inverting the clock connections to the pulse-latch circuit, the corresponding activation voltage can also be inverted. Thus, it is possible that the clock pulses could be depicted as being negative pulses with correspondingly short durations. For purposes of this disclosure, such a signal would still be considered to have a duty cycle of less than 50% because the active period is the negative portion of the waveform. Consistent with certain implementations, the short clock pulses for the latch mode can be generated by the time-borrowing circuitry, which can provide configurable clock timing. The device can be configured to provide the corresponding clock signal (time-borrowing or standard clock) depending upon the mode indicated by the CRAM configuration signal.

Not depicted in FIG. 5 are the clk[ ], clkb[ ] signal pairs for the remaining Mux_input signal lines. As the remaining signal pairs represent unselected signal lines, the corresponding clk[ ] and clkb[ ] signals would be kept in the inactive state, relative to the corresponding and respective input pass-gates.

Figure 6:
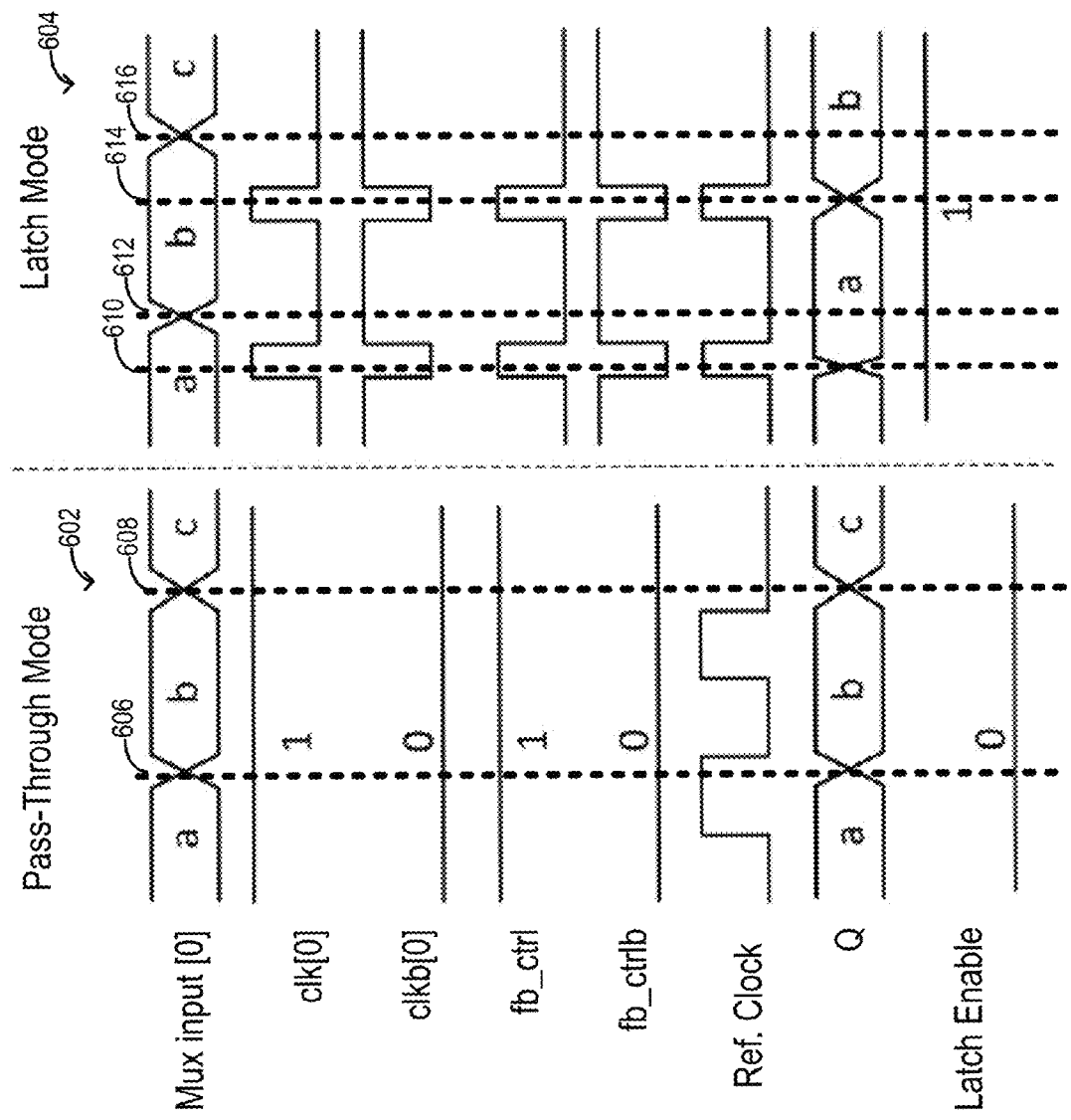
FIG. 6 depicts a signal timing diagram for circuits that are consistent with FIG. 4.

FIG. 6 depicts a signal timing diagram for circuits that are consistent with FIG. 4. The horizontal axis represents time with an arbitrary scale. The multiplexer (MUX) input [0] signal shows the value of selected multiplexer input. The values (a, b, c) represent arbitrary values. The different letters are presented for the purpose of showing changes to the input value, as may be relevant to when the changes are shown to appear on the output (Q).

Similar to the discussion of FIG. 5, the latch enable signal controls whether the circuit is in the pass-through mode 602 or the latch mode 604. When the latch enable signal is low ("0"), the latch functionality is disabled and the circuit acts as a multiplexer with a pass-through output. As discussed in connection with FIG. 4, the clock control circuit is configured to gate the reference clock relative to the fb_ctrl, fb_ctrlb and clk, clkb signal pairs. The fb_ctrl signal pair is held at a value that disables the feedback control, while the clk and clkb signals are held at a value that enables the pass-gate for the selected multiplexer input. In the depicted example, the Mux input [0] is selected.

The transition timings for the input (Mux input [0]) and output (Q) signals, relative to the reference clock, are essentially identical to the timings discussed in connection with FIG. 3. When in the pass-through mode, the output signal (Q) value changes asynchronously any time the input signal (Mux input [0]) value changes, as shown at time points 606 and 608. When in the latch mode, the output signal (Q) value changes synchronously with the Reference clock, as shown at time points 610 and 614. In the absence of a reference clock pulse, the output signal value maintains the stored value even when the input signal value changes at time points 612 and 616.

Not depicted in FIG. 6 are the clk, clkb signal pairs for the remaining Mux_input signal lines. As the remaining signal pairs represent unselected signal lines, the corresponding clk and clkb signals would be kept in the inactive state, relative to the corresponding and respective input pass-gates.

Figure 7:
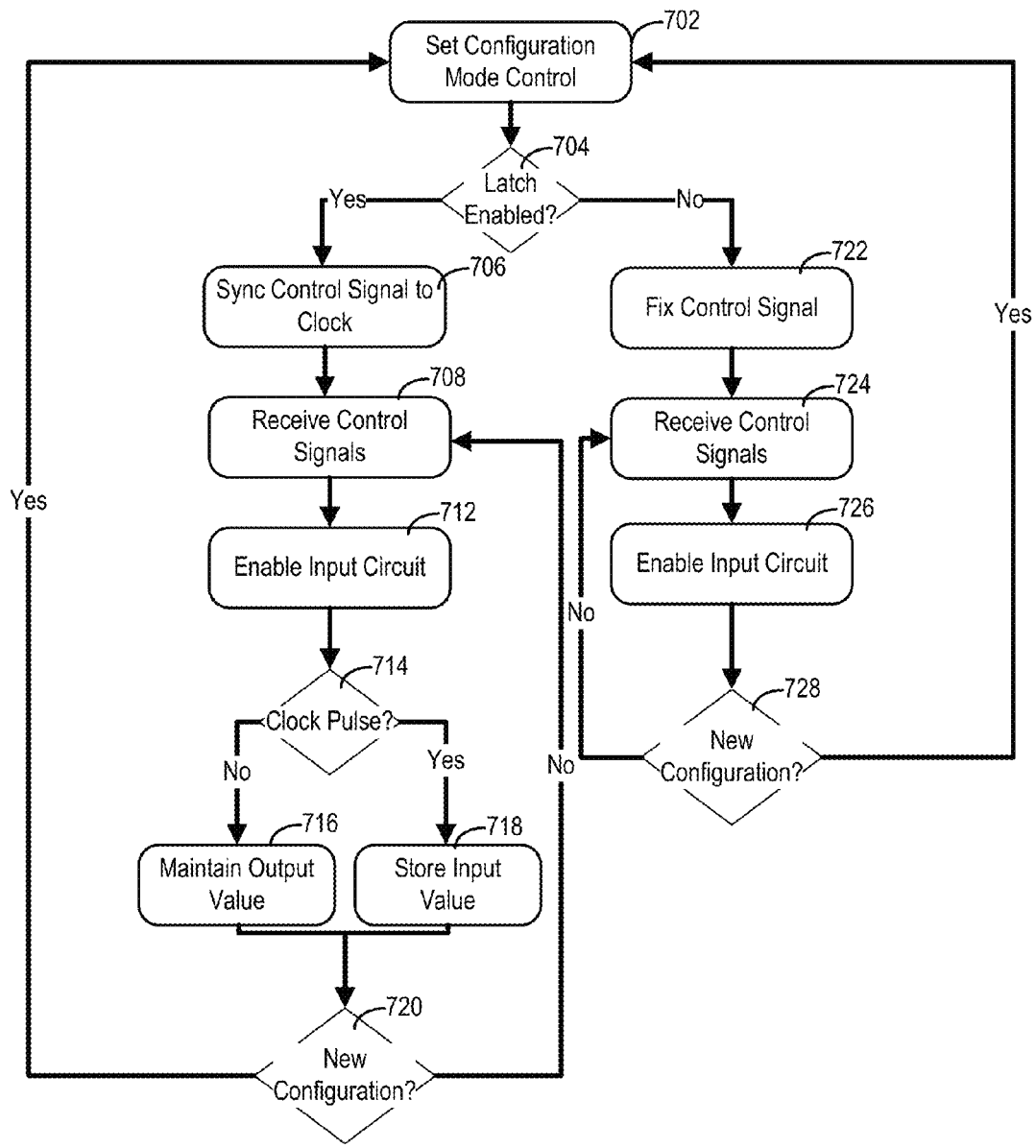
FIG. 7 depicts a flow diagram for use with a multiplexer-based circuit that includes pulse latch capabilities, consistent with implementations of the present disclosure.

FIG. 7 depicts a flow diagram for use with a multiplexer-based circuit that includes pulse latch capabilities, consistent with implementations of the present disclosure. The flow diagram can be used with various implementations and circuits discussed herein, including those discussed in connection with FIGS. 1-6. The flow starts with the setting of configuration mode control signals or settings, per block 702. For example, memory locations within a CRAM circuit could be written to in order to specify whether or not multiplexer-based circuits are configured to operate in a latch mode or in a pass-through mode. This might occur, for example, upon initialization of an FPGA or PLD device.

A clock control circuit can then determine whether or not the configuration signal (e.g., from a CRAM) specifies enabling of a latch, per block 704. For example, the latch enable signal depicted in FIGS. 5 and 6 can be provided to a clock control circuit that includes logic for determining the value of the latch enable signal and for responding accordingly. When the latch is enabled, the multiplexer-based circuit can be configured to operate in the latch mode by synchronizing the control signals (clk, fb_ctrl) to a provided reference clock, per block 706. As discussed in various examples, the reference clock could be provided from a nearby CLE or from other sources. The control signals can include signals for controlling the feedback of a latch and a pass-gate providing an input to the latch.

The multiplexer function can be implemented based upon the receipt of control signals, per block 708. The control signals can indicate a particular input circuit that is then enabled, per block 712. When a clock pulse is received, per block 714, the input data value can be stored in the latch, per block 718. Otherwise, the value in the latch can be maintained, per block 716. Blocks 712 and 714 are depicted separately, but various implementations allow for the enabling of the input circuit to be carried out synchronous to a received clock pulse. For example, the implementations discussed in connection with FIGS. 4 and 6 use input-pass-gate circuits that are synchronously controlled in response to both the control signals and the clock pulses.

According to various implementations, the multiplexer-based circuits can be reconfigured to a different mode, per block 720. In some implementations, the reconfiguration might correspond to a new configuration of programmable logic. In various implementations, the new configuration could be accomplished by reinitializing the PLD. Consistent with certain implementations, the new configuration could be accomplished through dynamic modifications that do not involve reinitializing the device.

When the latch is not enabled, the multiplexer-based circuit can be configured to operate in the pass-through mode by fixing the control signals, per block 722. For example, the control signals can be fixed to disable the feedback path of the latch. Moreover, for implementations that use a shared pulse-latch for the multiple inputs, the control signals can be fixed to enable the shared pulse-latch (e.g., as discussed in connection with FIGS. 3 and 5). The multiplexer function can be implemented based upon the receipt of control signals, per block 724. The selected input circuit can then be enabled in response to the control signals, per block 726 and consistent with the discussion of block 712. This allows the data on the shared output node of the multiplexer to be passed to the output of the latch circuit. Similar to the discussion of block 720, the multiplexer-based circuit can be reconfigured to operate in a different mode, per block 728.

Figure 8:
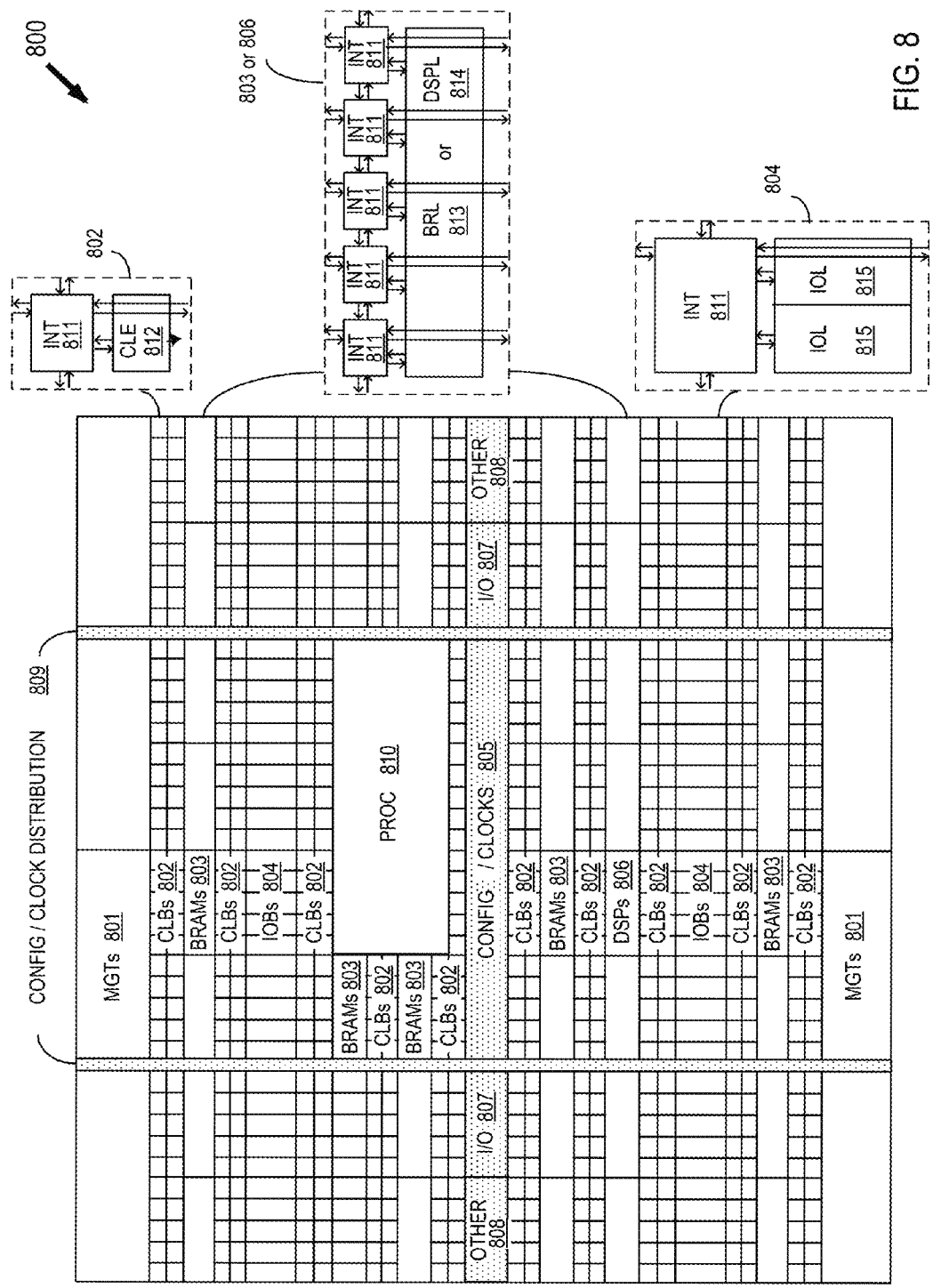
FIG. 8 shows a programmable integrated circuit (IC) 700 on which the disclosed circuits and processes may be implemented.

FIG. 8 shows a programmable integrated circuit (IC) 800 on which the disclosed circuits and processes may be implemented. The programmable IC may also be part of a chip that is sometimes referred to as a System On Chip (SOC). An SOC can include field programmable gate array logic (FPGA) along with other programmable resources. FPGA logic may include several different types of programmable logic blocks in the array. For example, FIG. 8 illustrates programmable IC 800 that includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some programmable IC having FPGA logic also include dedicated processor blocks (PROC) 810 and internal and external reconfiguration ports (not shown).

In some FPGA logic, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA logic. The programmable interconnect element INT 811 also includes the connections to and from the programmable logic element within the same tile, as shown by the examples included at the top of FIG. 8. The programmable interconnect element INT 811 can include one or more register circuits that are consistent with various implementations discussed herein.

For example, a CLB 802 can include a configurable logic element CLE 812 that can be programmed to implement user logic, plus a single programmable interconnect element INT 811. A BRAM 803 can include a BRAM logic element (BRL) 813 in addition to one or more programmable interconnect elements. Often, the number of interconnect elements included in a tile depends on the height of the tile. In the pictured example, a BRAM tile has the same height as five CLBs, but other numbers (e.g., four) can also be used. A DSP tile 806 can include a DSP logic element (DSPL) 814 in addition to an appropriate number of programmable interconnect elements. An IOB 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, can be manufactured using metal layered above the various illustrated logic blocks, and typically are not confined to the area of the input/output logic element 815.

In the pictured example, a columnar area near the center of the die (shown shaded in FIG. 8) is used for configuration, clock, and other control logic. Horizontal areas 809 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 8 include additional logic blocks that disrupt the regular columnar structure making up a large part of the programmable IC. The additional logic blocks can be programmable blocks and/or dedicated logic. For example, the processor block PROC 810 shown in FIG. 8 spans several columns of CLBs and BRAMs.

Note that FIG. 8 is intended to illustrate only an example programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely an example. For example, in an actual programmable IC, more than one adjacent column of CLBs is typically included wherever the CLBs appear, to facilitate the efficient implementation of user logic.

For the various flow diagrams depicted herein, the particular orders of the blocks and associated functions are provided as examples. The ordering is not necessarily limiting and can be varied according to various implementations.

Those skilled in the art will appreciate that various alternative computing arrangements, including one or more processors and a memory arrangement configured with program code, would be suitable for hosting the processes and data structures that may carry out functions disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use RAM circuits. Other aspects and features will be apparent to those skilled in the art from consideration of the specification. The portions of the methods and system may be implemented as one or more processors configured to execute software, as an application specific integrated circuit (ASIC), or as a logic on a programmable logic device. Moreover, the various circuits identified herein may share hardware circuitry, such as use of a common computer processing unit or digital processing unit. It is intended that the specification and drawings be considered as examples only, with a true scope of the invention being indicated by the following claims.

What is claimed is:

1. A device comprising:
a multiplexer circuit that includes a plurality of input circuits, each input circuit connected to a respective input node and a shared output node and configured to pass, in response to a respective control signal, a signal between the respective input and shared output node;
an output circuit configured to store data from the shared output node in a latch mode and to act as a buffer in a pass-through mode;
wherein the output circuit includes a buffer circuit, and a feedback circuit configured to provide a feedback signal to an input of the buffer circuit, wherein the feedback signal is responsive to an output of the buffer circuit, and the feedback circuit is configured to disable the feedback signal in response to an input circuit of the plurality of input circuits being enabled; and
a control circuit configured to switch, in response to a configuration signal, the output circuit between the latch mode and the pass-through mode.

2. The device of claim 1, wherein the multiplexer circuit is part of an interconnect tile that connects programmable logic in an integrated circuit chip.

3. The device of claim 2, wherein the configuration signal is controlled by configuration data stored in a configuration random access memory.

4. The device of claim 1, wherein the output circuit is further configured to reset, in response to a reset signal, data stored in the output circuit, and wherein the feedback circuit is configured to be disabled in response to the reset signal.

5. The device of claim 1, wherein the feedback circuit includes two transistor stacks, each transistor stack including a first transistor with a gate tied to the output of the buffer and a second transistor with a gate tied to the configuration signal.

6. The device of claim 1, wherein the output circuit includes a bypass circuit that selectively disconnects the output node from the output circuit.

7. The device of claim 6, wherein the output circuit is configured to operate as a pulse-latch that is responsive to clock pulses provided by the control circuit.

8. The device of claim 7, further comprising a clock control circuit including a NOR gate configured to generate, in response to a reference clock and a latch enable signal, the clock pulses.

9. The device of claim 1, further comprising:
a clock control circuit including:
a NOR gate configured to receive a reference clock and a latch enable signal as inputs; and
a plurality of AND gates each configured to receive an output of the NOR gate and a respective MUX input selection signal, and to generate an output that controls a respective input circuit of the plurality of input circuits.

10. A method for providing multiplexing functionality, the method comprising:
receiving a set of control signals;
enabling, in response to the set of control signals, an input circuit from a plurality of input circuits, each input circuit configured to pass, in response to a respective control signal from the set of control signals, a signal between a respective input and a shared output node;

storing, in an output circuit and responsive to a clock signal, data from the shared output node in a latch mode, wherein the output circuit includes a buffer circuit, and a feedback circuit;

providing a feedback signal from the feedback circuit to an input of the buffer circuit, wherein the feedback signal is responsive to an output of the buffer circuit disabling the feedback signal by the feedback circuit in response to an input circuit of the plurality of input circuits being enabled; and switching, in response to a configuration signal, the output circuit from the latch mode to a pass-through mode by fixing the clock signal to allow data to pass from the shared output node to a latch of the output circuit.

11. The method of claim 10, further comprising resetting, in response to a reset signal, the data stored in the output circuit.

12. The method of claim 11, wherein the resetting includes disabling the feedback circuit to overwrite the stored data.

13. The method of claim 10, wherein the output circuit is part of an interconnect tile that connects programmable logic in an integrated circuit chip.

14. The method of claim 13, further comprising providing the configuration signal from configuration data stored in a configuration random access memory.

15. The method of claim 10, further comprising generating a set of pulses for use as a control signal of the set of control signals.

16. The method of claim 15, wherein the generating the set of pulses includes using a time-borrowing circuit of a programmable integrated circuit.

\* \* \* \* \*